United States Patent
Kihara (10) Patent No.: US 10,503,291 B2
(45) Date of Patent: Dec. 10, 2019

(54) TOUCH INPUT DEVICE AND ELECTRONIC DEVICE

(71) Applicant: Murata Manufacturing Co., Ltd., Nagaokakyo-shi, Kyoto-fu (JP)

(72) Inventor: Takashi Kihara, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/438,998

(22) Filed: Feb. 22, 2017

(65) Prior Publication Data

US 2017/0177106 A1    Jun. 22, 2017

Related U.S. Application Data

(63) Continuation of application No. PCT/JP2015/074332, filed on Aug. 28, 2015.

(30) Foreign Application Priority Data

Sep. 3, 2014  (JP) .................. 2014-179080

(51) Int. Cl.
*G06F 3/041* (2006.01)
*H01L 41/113* (2006.01)
*H01L 41/193* (2006.01)

(52) U.S. Cl.
CPC .......... *G06F 3/041* (2013.01); *H01L 41/1132* (2013.01); *H01L 41/193* (2013.01)

(58) Field of Classification Search
CPC ..... G06F 3/041; H01L 41/193; H01L 41/1132
See application file for complete search history.

(56) References Cited

U.S. PATENT DOCUMENTS

| | | | | |
|---|---|---|---|---|
| 2012/0086651 A1* | 4/2012 | Kwon | .................. | G06F 3/016 345/173 |
| 2013/0027339 A1* | 1/2013 | Kodani | .................. | G01L 1/16 345/173 |
| 2013/0251969 A1* | 9/2013 | Sasaki | .............. | G02F 1/133308 428/214 |
| 2014/0292699 A1* | 10/2014 | Ando | ................... | G06F 3/0414 345/173 |

(Continued)

FOREIGN PATENT DOCUMENTS

JP   2005-352927 A   12/2005
JP   2012-175250 A    9/2012

(Continued)

OTHER PUBLICATIONS

International Search Report issued in International Application No. PCT/JP2015/074332, dated Nov. 10, 2015.

(Continued)

*Primary Examiner* — Alexander Eisen
*Assistant Examiner* — Kebede T Teshome
(74) *Attorney, Agent, or Firm* — Arent Fox LLP (57) ABSTRACT

A touch input device that includes a housing which has an insulation property; a piezoelectric element group which includes a plurality of piezoelectric elements which produce charges when stretched in a direction parallel to a flat film surface; and an adhesive member which adheres the piezoelectric element group to a back surface of the housing.

15 Claims, 6 Drawing Sheets

(56) References Cited

U.S. PATENT DOCUMENTS

| | | | | |
|---|---|---|---|---|
| 2015/0270472 A1* | 9/2015 | Nagahata | ................ | B41J 2/161 |
| | | | | 310/365 |
| 2015/0331517 A1* | 11/2015 | Filiz | ..................... | G06F 3/0414 |
| | | | | 345/173 |
| 2015/0346881 A1* | 12/2015 | Watazu | .................... | G01L 1/16 |
| | | | | 345/174 |
| 2016/0320899 A1* | 11/2016 | Watazu | .................. | G06F 3/047 |

FOREIGN PATENT DOCUMENTS

| | | | | | |
|---|---|---|---|---|---|
| JP | 2012175250 A | * | 9/2012 | | |
| JP | 2013-153292 A | | 8/2013 | | |
| WO | WO-2013021835 A1 | * | 2/2013 | ............. | G06F 3/044 |

OTHER PUBLICATIONS

Written Opinion of the International Searching Authority issued in International Application No. PCT/JP2015/074332, dated Nov. 10, 2015.

\* cited by examiner

TOUCH INPUT DEVICE AND ELECTRONIC DEVICE

CROSS REFERENCE TO RELATED APPLICATIONS

The present application is a continuation of International application No. PCT/JP2015/074332, filed Aug. 28, 2015, which claims priority to Japanese Patent Application No. 2014-179080, filed Sep. 3, 2014, the entire contents of each of which are incorporated herein by reference.

FIELD OF THE INVENTION

The present invention relates to a touch input device which detects an input operation of an operator.

BACKGROUND OF THE INVENTION

Conventionally, electronic devices such as audio video devices have operation input switches. For the operation switches, mechanical switches and capacitive switches are generally used.

For example, in an audio video device disclosed in Patent Literature 1, a capacitive switch is disposed on a front surface of a housing.

Patent Document 1: Japanese Patent Application Laid-Open No. 2013-153292

SUMMARY OF THE INVENTION

However, each mechanical switch receives an operation input by causing parts of each mechanical switch to physically move. Therefore, there is a problem that, when the number of times of use increases, mechanical connection portions are readily damaged.

A capacitive switch can receive an operation input in response to a touch on an operation surface thereof, yet has a problem in that such capacitive switches have difficulty in adjusting a detection sensitivity and are likely to cause erroneous detection.

It is therefore an object of the present invention to provide a reliable touch input device which accurately detects an input operation.

A touch input device according to the present invention includes a housing which has an insulation property; a plurality of piezoelectric elements which have a flat film shape and produce voltages when stretched in a direction parallel to a flat film surface; and an adhesive member which adheres the plurality of piezoelectric elements to a back surface of the housing.

According to this configuration, when an operator pushes a front surface of the housing, the piezoelectric element disposed on the back surface of a pushing position stretches, so that it is possible to detect an operation input made by the push. Consequently, it is possible to detect the operation input and the operation input position.

Further, preferentially, the touch input device according to the present invention is configured such that, when a first piezoelectric element opposed to a pushed position on the front surface of the housing produces a voltage, a second piezoelectric element adjacent the first piezoelectric element produces a voltage ¹⁄₁₀ or less of that produced by the first piezoelectric element.

According to this configuration, it is possible to more accurately detect an operation position by simple post-processing.

Further, the touch input device according to the present invention may be configured such that the plurality of piezoelectric elements include a piezoelectric sheet which produces a charge in response to the stretching, detection electrodes are aligned on opposed sides of the piezoelectric sheet, and a modulus of an adhesive member is lower than a modulus of a housing.

According to this configuration, it is possible to integrally form a plurality of piezoelectric elements. Consequently, it is possible to easily dispose a plurality of piezoelectric elements in the housing while accurately maintaining the alignment intervals between the plurality of piezoelectric elements. Further, by defining the modulus of the adhesive member as described above, it is possible to prevent stretching in a direction orthogonal to an alignment direction without attenuating stretching of the piezoelectric sheet in the alignment direction caused by a distortion of the housing. Consequently, it is possible to more accurately detect the operation position.

Further, preferably, in the touch input device according to the present invention, the modulus of the adhesive member is $10^7$ Pa or less. According to this configuration, it is possible to more reliably and accurately detect the operation input.

Further, the touch input device according to the present invention may be configured such that adhesive member does not overlap the detection electrodes.

According to this configuration, it is also possible to integrally form a plurality of piezoelectric elements. Consequently, it is possible to easily dispose a plurality of piezoelectric elements in the housing while accurately maintaining the alignment intervals between the plurality of piezoelectric elements. Further, it is possible to prevent stretching in the direction orthogonal to the alignment direction without attenuating stretching of the piezoelectric sheet in the alignment direction caused by a distortion of the housing. Consequently, it is possible to more accurately detect the operation position.

Further, the touch input device according to the present invention may be configured such that plurality of piezoelectric elements each includes a single piezoelectric sheet which produces a charge in response to the stretching, and detection electrodes formed on the piezoelectric sheet.

According to this configuration, it is possible to prevent stretching in the direction orthogonal to the alignment direction without attenuating stretching of the piezoelectric sheet in the alignment direction caused by a distortion of the housing. Consequently, it is possible to more accurately detect the operation position.

Further, an electronic device according to the present invention includes: the touch input device described above; and a functional unit which realizes a function corresponding to an operation input to the touch input device. A housing of the touch input device composes at least part of a housing which covers the functional unit.

According to this configuration, it is possible to use part of the housing of the electronic device for the touch input device.

According to the present invention, it is possible to realize a reliable touch input device which accurately detects an operation input.

DETAILED DESCRIPTION OF THE INVENTION

Figure 1:
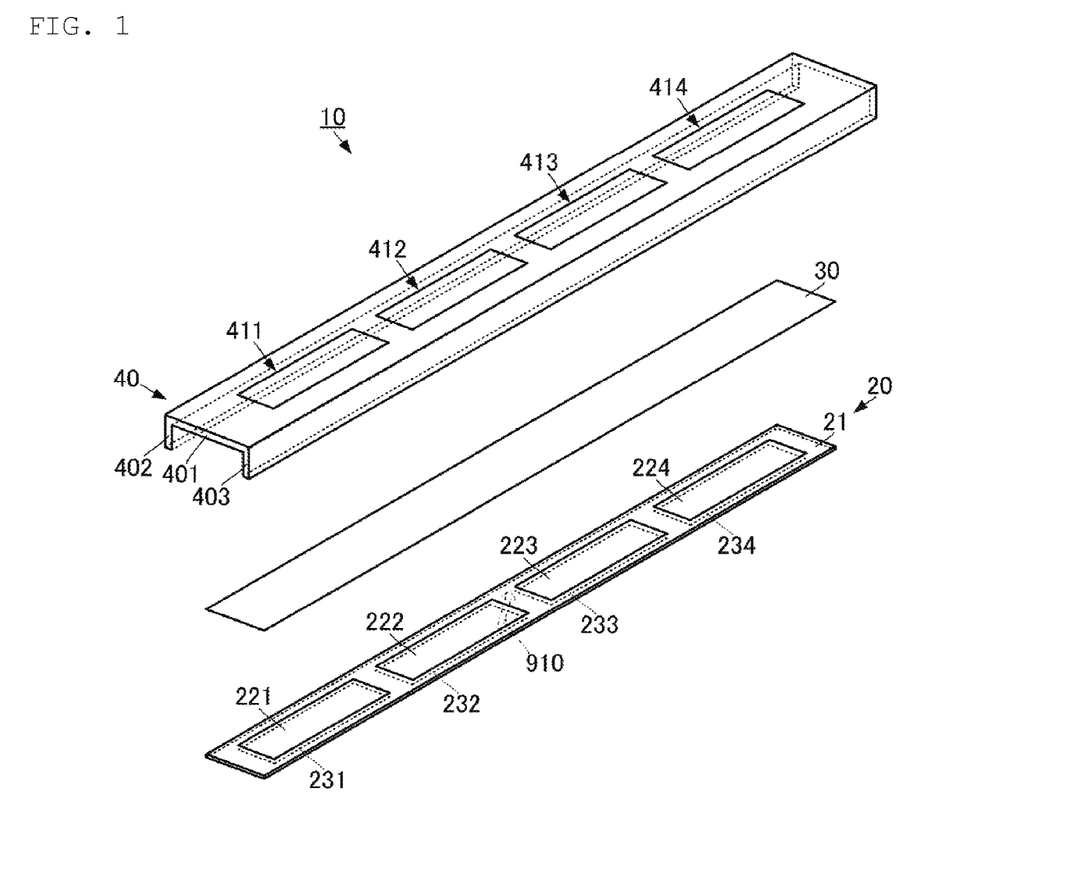
FIG. 1 is an exploded perspective view of a touch input device according to a first embodiment of the present invention.
Figure 2:
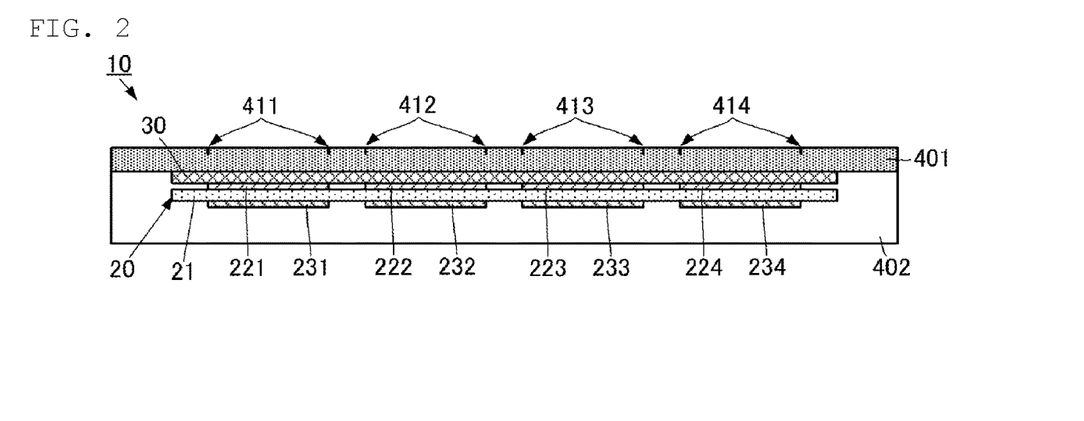
FIG. 2 is a side sectional view of the touch input device according to the first embodiment of the present invention.

A touch input device according to a first embodiment of the present invention will be described with reference to the accompanying drawings. FIG. 1 is an exploded perspective view of the touch input device according to the first embodiment of the present invention. FIG. 2 is a side sectional view of the touch input device according to the first embodiment of the present invention.

A touch input device 10 includes a piezoelectric element group 20, an adhesive member 30 and a housing 40.

The piezoelectric element group 20 includes a piezoelectric sheet 21, a plurality of first detection electrodes 221, 222, 223 and 224 and a plurality of second detection electrodes 231, 232, 233 and 234.

The piezoelectric sheet 21 is a flat film of an elongated shape. The piezoelectric sheet 21 is made of a piezoelectric material which produces charges in facing flat film surfaces in response to stretching. For example, the piezoelectric sheet 21 is made of uniaxially stretched polylactic acid (PLA) and, more specifically, poly-L-lactide (PLLA). A uniaxial stretching direction of the polylactic acid is a direction which forms approximately 45° with respect to a longitudinal direction of the piezoelectric sheet 21 as indicated by a dashed-two dotted line bold arrow 910 in FIG. 1.

In this regard, an angle to be formed is the more preferably 45° yet may be in a range of approximately ±10° of 45°.

Hereinafter, characteristics of the PLLA for forming the piezoelectric sheet 21 will be described.

The PLLA is made of chiral polymer. A main chain of the PLLA adopts a helical structure. The PLLA has piezoelectricity as a result of molecule orientation when molecules are oriented in a direction in which the PLLA is uniaxially stretched. Further, the uniaxially stretched PLLA produces charges when the piezoelectric sheet 21 stretches in a predetermined direction. The charge amount to be produced is determined according to a stretching amount of the piezoelectric sheet 21. A piezoelectric constant of the uniaxially stretched PLLA belongs to a group of very high piezoelectric constants among polymers. For example, a piezoelectric distortion constant $d_{14}$ of the PLLA takes a high value of 10 to 20 pC/N by adjusting conditions such as stretching conditions, heating processing conditions and additive blending.

Further, it is possible to effectively produce charges in an aspect where the direction in which the piezoelectric sheet 21 stretches and the uniaxial stretching direction forms an angle of 45°.

In addition, the stretching ratio of the piezoelectric sheet 21 is preferably approximately three to eight times. Applying heat processing after stretching encourages crystallization of extended chain crystal of polylactic acid, so that the piezoelectric constant increases. In addition, in case of biaxial stretching, it is possible to provide the same effect as that of uniaxial stretching by varying stretch ratios of respective axes. When, for example, a sheet is stretched eight times in a given direction as an X axis direction and is stretched two times in a Y axis direction orthogonal to the X axis, it is possible to provide a substantially same effect of the piezoelectric constant as that obtained when a sheet is uniaxially stretched four times in the X axis direction. A simply uniaxially stretched sheet is likely to be broken in a stretching axis direction, and therefore it is possible to enhance the strength to some degree by biaxially stretching the PLLA as described above.

Further, the PLLA produces the piezoelectricity during processing of orienting molecules by way of stretching or the like, and does not need to be subjected to poling processing unlike other polymers such as PVDF or a piezoelectric ceramics. That is, the piezoelectricity of the PLLA which does not belong to a ferroelectric is not exhibited by ion polarization unlike ferroelectrics such as PVDF or PZT, and derives from a helical structure which is a characteristic structure of molecules. Therefore, the PLLA does not produce pyroelectricity produced in piezoelectric bodies of other ferroelectrics. Further, the piezoelectric constant of the PVDF and the like temporally fluctuates and remarkably lowers depending on cases. However, the piezoelectric constant of the PLLA is temporally very stable. Consequently, an output charge amount is not influenced by a duration of a use time and a surrounding environment.

A plurality of first detection electrodes 221, 222, 223 and 224 are disposed on a surface of the piezoelectric sheet 21 and aligned at intervals along a longitudinal direction of the piezoelectric sheet 21.

A plurality of second detection electrodes 231, 232, 233 and 234 are disposed on a back surface of the piezoelectric sheet 21 and disposed at positions facing the first detection electrodes 221, 222, 223 and 224.

According to this configuration, it is possible to realize a configuration where a plurality of piezoelectric elements is aligned at intervals along the longitudinal direction of the piezoelectric sheet 21. More specifically, a first piezoelectric element is a portion at which the first detection electrode 221 and the second detection electrode 231 are disposed facing each other on both surfaces of the piezoelectric sheet 21, and a second piezoelectric element is a portion at which the first detection electrode 222 and the second detection electrode 232 are disposed facing each other on the both surfaces of the piezoelectric sheet 21. A third piezoelectric element is a portion at which the first detection electrode 223 and the second detection electrode 233 are disposed facing each other on both surfaces of the piezoelectric sheet 21, and a fourth piezoelectric element is a portion at which the first detection electrode 224 and the second detection electrode 234 are disposed facing each other on the both surfaces of the piezoelectric sheet 21.

The adhesive member 30 is a flat film having the substantially same shape as that of the piezoelectric sheet 21 when seen from the plan view. A modulus of the adhesive member 30 is lower than a modulus of the housing 40. More preferably, the modulus of the adhesive member 30 is $10^7$ Pa or less.

The housing 40 is made of an insulation resin. The housing 40 includes a front wall 401, a first sidewall 402 and a second sidewall 403. The front wall 401, the first sidewall 402 and the second sidewall 403 are flat plates of elongated shapes. The first sidewall 402 is connected to one side surface which extends in the longitudinal direction of the front wall 401. The second sidewall 403 is connected to the other side surface which extends in the longitudinal direction of the front wall 401. Flat surfaces of the first sidewall 402 and the second sidewall 403 are orthogonal to a flat surface of the front wall 401. The first sidewall 402 and the second sidewall 403 face each other. According to this configuration, a space surrounded by the front wall 401 and the first and second sidewalls 402 and 403 is formed at a back surface side of the front wall 401.

Operation position marks 411, 412, 413 and 414 are formed at predetermined intervals along the longitudinal direction on the surface of the front wall 401.

The piezoelectric element group 20 is adhered to a back surface of the front wall 401 by using the adhesive member 30. In this case, the piezoelectric element group 20 is adhered such that the flat film surface of the piezoelectric sheet 21 faces the back surface of the front wall 401.

In this case, as illustrated in FIG. 2, an area in which the first detection electrode 221 and the second detection electrode 231 are disposed (a first piezoelectric element formation area) and the operation position mark 411 overlap, and an area in which the first detection electrode 222 and the second detection electrode 232 are disposed (second piezoelectric element formation area) and the operation position mark 412 overlap. An area in which the first detection electrode 223 and the second detection electrode 233 are disposed (a third piezoelectric element formation area) and the operation position mark 413 overlap, and an area in which the first detection electrode 224 and the second detection electrode 234 are disposed (fourth piezoelectric element formation area) and the operation position mark 414 overlap.

By employing such a configuration, when an operator pushes the surface of the front wall 401 of the housing 40, a distortion of the front wall 401 of the housing 40 stretches the piezoelectric sheet 21 and produces charges. In this case, by using the touch input device 10 according to the present embodiment, it is possible to identify and detect a push (operation input) on the operation position marks 411, 412, 413 and 414.

Figure 3:
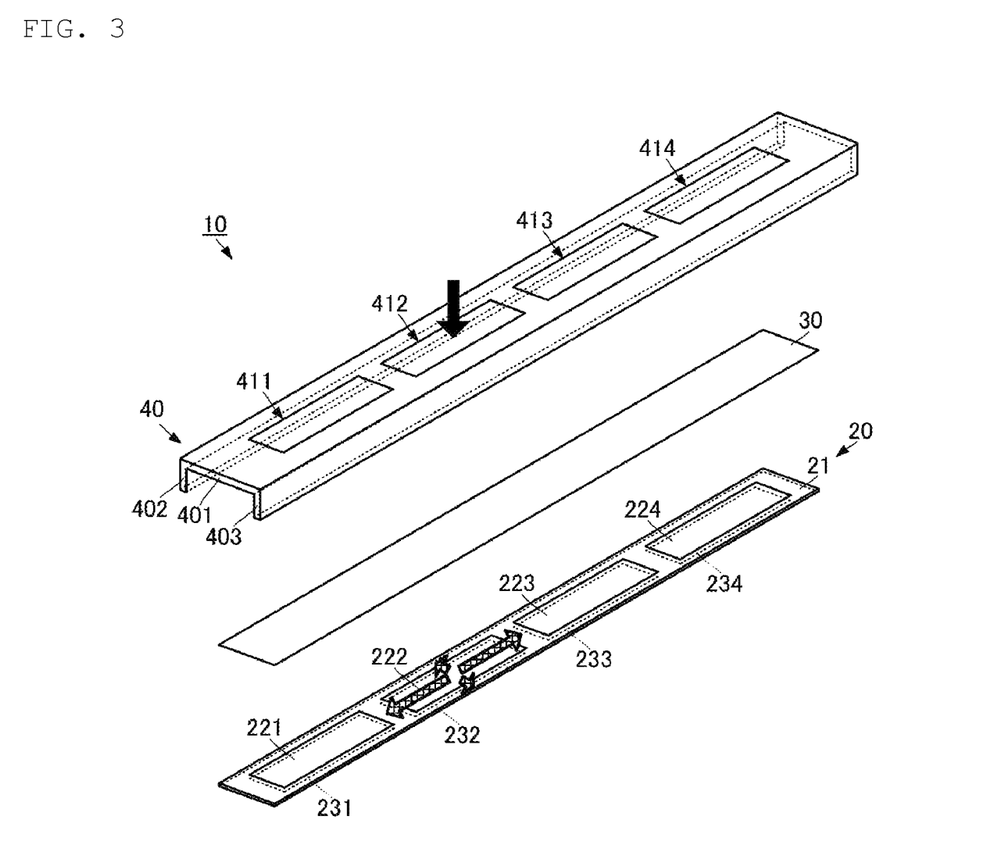
FIG. 3 is an exploded perspective view illustrating a stretched state of a piezoelectric sheet of the touch input device according to the first embodiment of the present invention.
Figure 4:
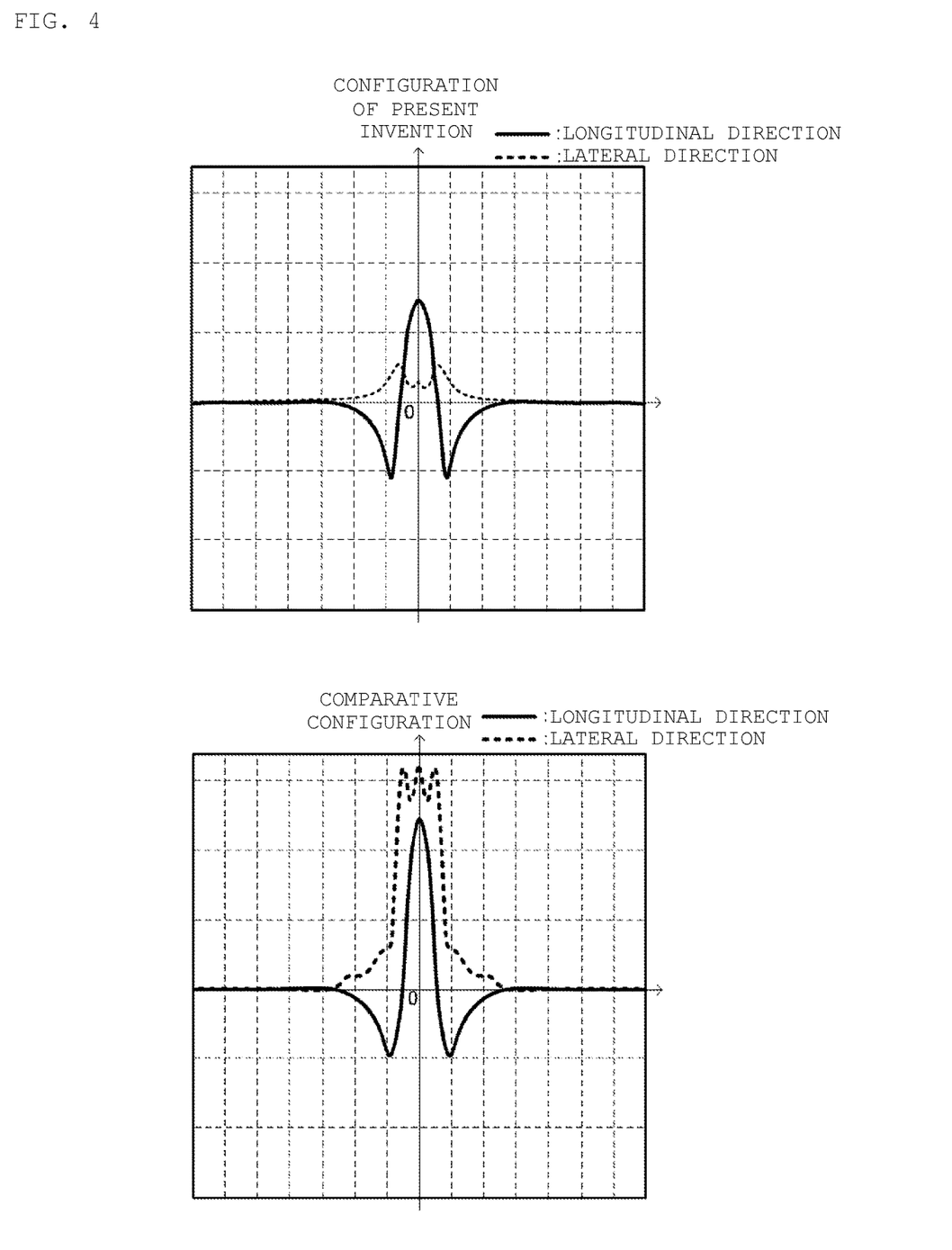
FIG. 4 illustrates graphs illustrating produced charge amounts produced by stretching in a longitudinal direction and a lateral direction in the touch input device according to the first embodiment of the present invention and a comparative configuration.
Figure 5:
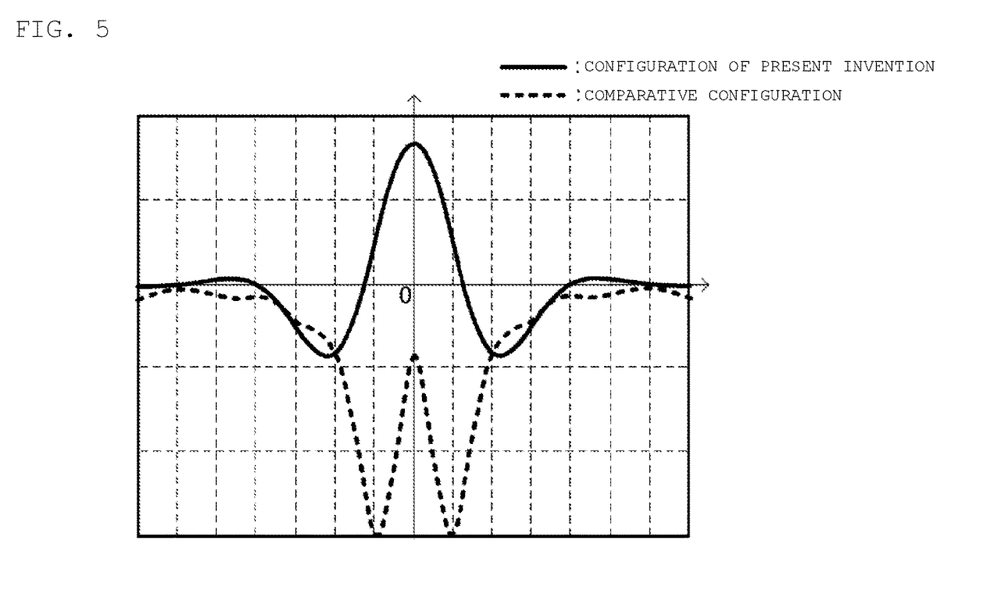
FIG. 5 illustrates a graph of output voltage characteristics of the touch input device according to the first embodiment of the present invention and the comparative configuration.

Next, a detection concept of the touch input device 10 according to the present embodiment will be described with reference to the drawings. FIG. 3 is an exploded perspective view illustrating a stretched state of the piezoelectric sheet of the touch input device according to the first embodiment of the present invention. FIG. 4 illustrates graphs illustrating produced charge amounts produced by stretching in the longitudinal direction and a lateral direction in the touch input device according to the first embodiment of the present invention and a comparative configuration. In FIG. 4, a horizontal axis indicates a position coordinate whose origin is a pushing position when seen from the plan view, and a vertical axis indicates a voltage value. FIG. 5 illustrates a graph of output voltage characteristics of the touch input device according to the first embodiment of the present invention and the comparative configuration. In FIG. 5, a horizontal axis indicates a position coordinate whose origin is a pushing position when seen from the plan view, and a vertical axis indicates a voltage value.

As illustrated in FIG. 3, when an area of the operation position mark 412 of the housing 40 is pushed, the housing 40 is distorted, and the piezoelectric sheet 21 stretches. In this case, an area of the piezoelectric sheet 21 which stretches the most is an area which overlaps (faces) the operation position mark 412.

In this regard, by using the adhesive member 30 of the low modulus, it is possible to prevent the piezoelectric sheet 21 from stretching in the lateral direction without attenuating stretching of the piezoelectric sheet 21 in the longitudinal direction as indicated by hatched arrows in FIG. 3.

Consequently, it is possible to obtain a voltage of a positive maximum value from a pushing position in the longitudinal direction as indicated in the upper graph in FIG. 4. Meanwhile, a voltage value is low as a whole in the lateral direction as indicated in the upper graph in FIG. 4. Hence, the voltage produced by the stretching in the longitudinal direction and the voltage produced by stretching in the lateral direction do not cancel each other. Consequently, it is possible to detect the voltage of the positive maximum value from the pushing position in the longitudinal direction as indicated by a solid line in FIG. 5, and reliably detect an operation input. Further, the voltage value at the pushing position is sufficiently higher than voltage values at other positions in the longitudinal direction. Consequently, even when a plurality of piezoelectric elements is aligned in the longitudinal direction, it is possible to accurately detect a pushed position of the housing 40.

In this case, the alignment intervals between a plurality of piezoelectric elements are such intervals that, when a desired position (an area indicated by the operation position mark 411) on the surface of the housing 40 is pushed, a piezoelectric element (second piezoelectric element) produces a voltage 1/10 or less of that produced by an adjacent piezoelectric element (first piezoelectric element) facing this position. By employing these piezoelectric element alignment intervals, it is possible to more reliably identify an operation position.

In this regard, as illustrated in the lower graph in FIG. 4 and in FIG. 5, the comparative configuration has difficulty in accurately detecting a pushing position. The comparative configuration is a configuration where a modulus of an adhesive member is the same or higher than that of a housing. According to this configuration, the piezoelectric sheet 21 stretches not only in the longitudinal direction but also in the lateral direction. Hence, as illustrated in the lower graph in FIG. 4, the substantially same positive voltages are produced both in the longitudinal direction and the lateral direction, and cancel each other. Consequently, as illustrated in FIG. 5, an absolute value of the voltage lowers at a pushing position. Further, in this case, an absolute value of a voltage at a position which is a predetermined distance apart from the pushing position becomes high. This is because, while the piezoelectric sheet 21 is deformed stretching at the pushing position of the housing 40, an area to which a contracting stress is applied is produced on both sides of a stretching area. Hence, even when a voltage is detected based on an absolute value in the comparative configuration, this area to which the contracting stress is applied maximizes, and therefore it is not possible to accurately detect the pushing position.

As described above, by using the configuration according to the present embodiment, it is possible to accurately and reliably detect an operation input to the surface of the housing 40. Further, by using the configuration according to the present embodiment, it is possible to accurately detect an operation input position.

Even in case of an aspect in particular where a plurality of input positions is aligned on the surface of the housing 40, it is possible to accurately identify and detect an operation input with respect to each operation input position.

Further, by using the configuration according to the present embodiment and, more particularly, by using polylactic acid, pyroelectricity is not produced and piezoelectric characteristics do not temporally change. Consequently, it is possible to realize a reliably touch input device.

Furthermore, the configuration according to the present embodiment includes only the piezoelectric elements, the adhesive member and the housing. A simple configuration can realize the reliable touch input device which can accurately identify an operation input position.

Still further, when a mechanical switch is used, operation position marks need to be physically separated from a surface wall, and this separation produces a gap. However, by using the configuration according to the present embodiment, such physical separation is not necessary, and a gap is not produced. Consequently, it is possible to prevent unnecessary materials such as moisture and dust from entering inside from an outside of the front wall, and improve reliability.

Figure 6:
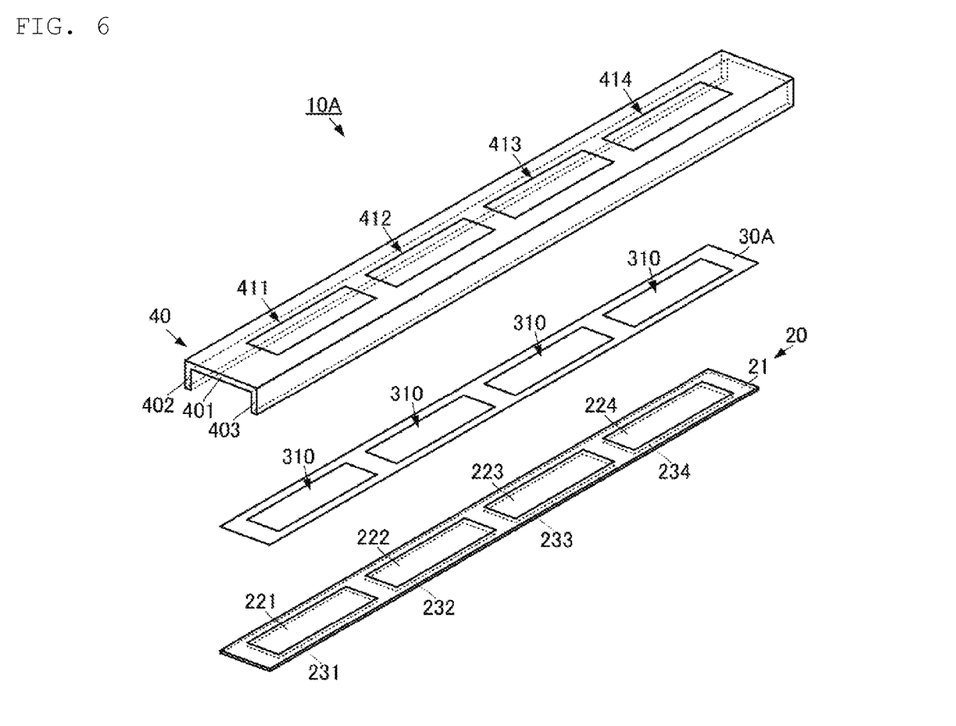
FIG. 6 is an exploded perspective view of a touch input device according to a second embodiment of the present invention.

A touch input device according to a second embodiment of the present invention will be described with reference to the accompanying drawings. FIG. 6 is an exploded perspective view of the touch input device according to the second embodiment of the present invention.

A touch input device 10A according to the present embodiment differs from the touch input device 10 according to the first embodiment in a configuration of an adhesive member 30A. Other components are the same as those of the touch input device 10 according to the first embodiment.

A plurality of openings 310 is provided on the adhesive member 30A. The plurality of openings 310 are aligned along a longitudinal direction of the adhesive member 30A. The adhesive member 30A is provided at positions which do not overlap first detection electrodes 221, 222, 223 and 224 when a piezoelectric element group 20A is adhered to a housing 40 with the adhesive member 30A interposed therebetween. That is, each opening 310 is provided in adhesive member 30A surrounding the first detection electrodes 221, 222, 223 and 224 when the touch input device 10A is seen from a plan view.

The adhesive member 30A may have the substantially same modulus as that of the housing 40.

Even this configuration can provide the same function and effect as those of the first embodiment.

Figure 7:
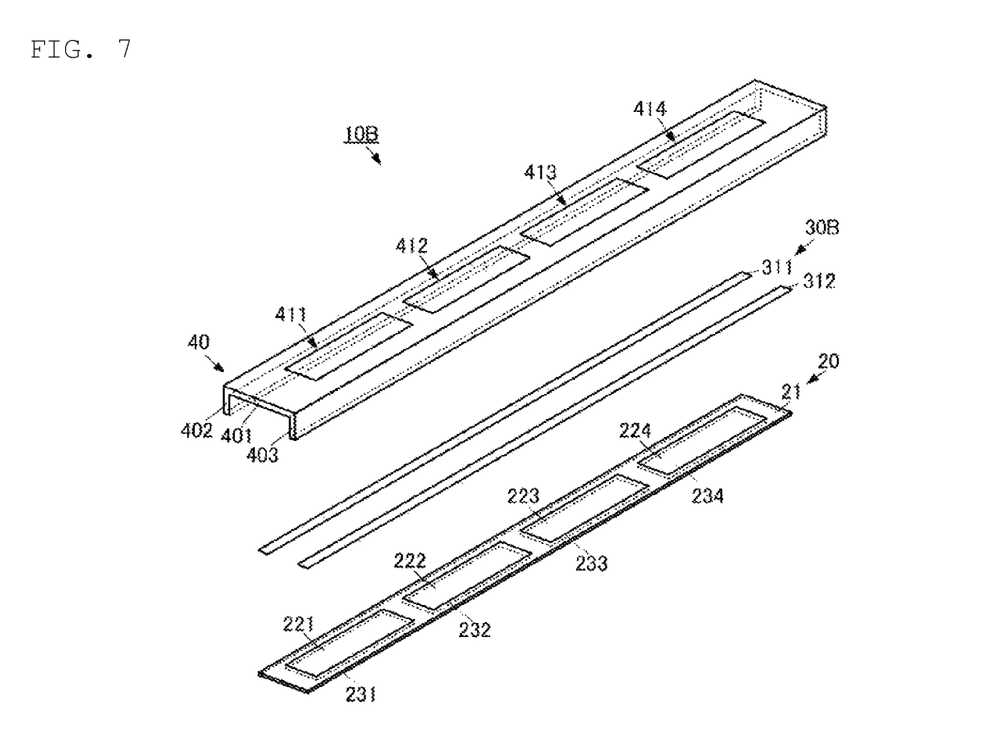
FIG. 7 is an exploded perspective view of a touch input device according to a third embodiment of the present invention.

A touch input device according to a third embodiment of the present invention will be described with reference to the accompanying drawings. FIG. 7 is an exploded perspective view of the touch input device according to the third embodiment of the present invention.

A touch input device 10B according to the present embodiment differs from the touch input device 10A according to the second embodiment in a configuration of an adhesive member 30B. Other components are the same as those of the touch input device 10A according to the second embodiment.

The adhesive member 30B includes a first elongated member 311 and a second elongated member 312. The widths of the first elongated member 311 and the second elongated member 312 (the widths in a lateral direction) are narrower than the width of an adhesive member 30 (the length in the lateral direction) according to the first embodiment.

The first elongated member 311 is disposed between positions at which the first detection electrodes 221, 222, 223 and 224 are disposed on a piezoelectric sheet 21, and a first edge side along a longitudinal direction.

The second elongated member 312 is disposed between positions at which the first detection electrodes 221, 222, 223 and 224 are disposed on the piezoelectric sheet 21, and a second edge side along the longitudinal direction.

Even this configuration can provide the same function and effect as those of the above embodiments.

Figure 8:
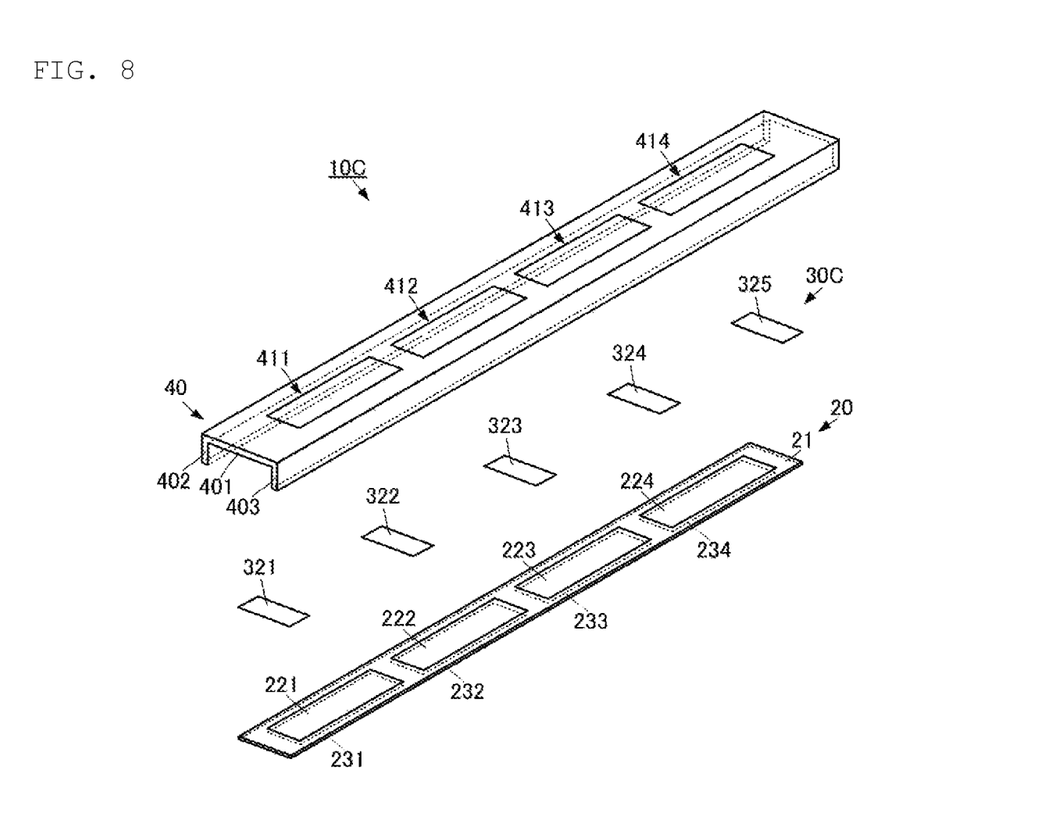
FIG. 8 is an exploded perspective view of a touch input device according to a fourth embodiment of the present invention.

A touch input device according to a fourth embodiment of the present invention will be described with reference to the accompanying drawings. FIG. 8 is an exploded perspective view of the touch input device according to the fourth embodiment of the present invention.

A touch input device 10C according to the present embodiment differs from the touch input device 10B according to the third embodiment in a configuration of an adhesive member 30C. Other components are the same as those of the touch input device 10B according to the third embodiment.

The adhesive member 30C includes a plurality of individual members 321, 322, 323, 324 and 325.

The individual member 321 is disposed between a first edge side of a piezoelectric sheet 21 along a lateral direction, and a first detection electrode 221. The individual member 322 is disposed between first detection electrodes 221 and 222 of the piezoelectric sheet 21. The individual member 323 is disposed between first detection electrodes 222 and 223 of the piezoelectric sheet 21. The individual member 324 is disposed between first detection electrodes 223 and 224 of the piezoelectric sheet 21. The individual member 325 is disposed between first detection electrodes 224 of the piezoelectric sheet 21 and a second edge side along the lateral direction.

Even this configuration can provide the same function and effect as those of the above embodiments.

Figure 9:
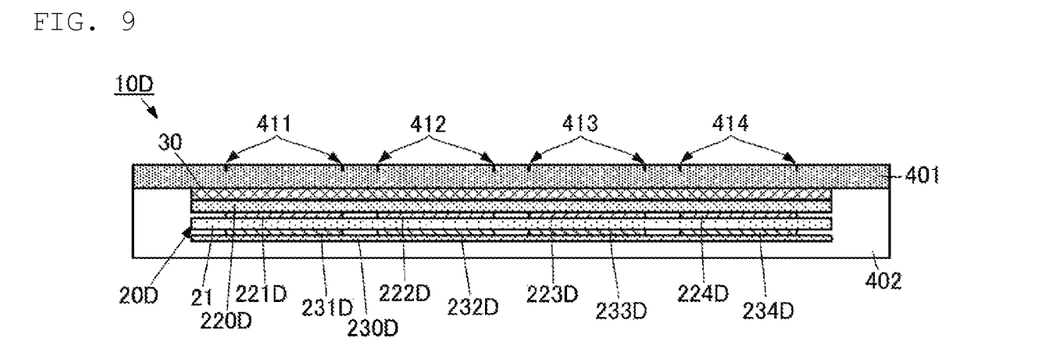
FIG. 9 is a side sectional view of a touch input device according to a fifth embodiment of the present invention.

A touch input device according to a fifth embodiment of the present invention will be described with reference to the accompanying drawings. FIG. 9 is a side sectional view of the touch input device according to the fifth embodiment of the present invention.

A touch input device 10D according to the present embodiment differs from the touch input device 10 according to the first embodiment in a configuration of a piezoelectric element group 20D. Other components are the same as those of the touch input device 10 according to the first embodiment.

The piezoelectric element group 20D includes a piezoelectric sheet 21, first detection electrodes 221, 222, 223 and 224, second detection electrodes 231, 232, 233 and 234, an insulation substrate 220D and an insulation flexible sheet 230D.

The first detection electrodes 221, 222, 223 and 224 are formed on a surface of the insulation substrate 220D. Surfaces of the first detection electrodes 221, 222, 223 and 224 are in contact with a surface of the piezoelectric sheet 21.

The second detection electrodes 231, 232, 233 and 234 are formed on a surface of the insulation flexible sheet 230D. The second detection electrodes 231, 232, 233 and 234 are in contact with a back surface of the piezoelectric sheet 21.

Even this configuration can provide the same function and effect as those of the above embodiments. Further, by using the configuration according to the present embodiment, it is possible to easily dispose detection electrodes on a piezoelectric sheet on which electrodes cannot be easily formed.

In this regard, aspects where a plurality of piezoelectric elements is aligned by disposing pluralities of the first detection electrodes and the second detection electrodes on one piezoelectric sheet have been described in the above embodiments. However, a plurality of piezoelectric elements may be formed by using individual piezoelectric sheets, and may be aligned and disposed on the housing 40. In this regard, according to the aspect where the above one piezoelectric sheet is used, it is possible to easily fix a positional relationship between a plurality of piezoelectric elements. Consequently, it is possible to reduce an error of positions at which a plurality of piezoelectric elements is disposed, and easily form the touch input device which can accurately detect an operation input and an operation position.

Further, the aspects where the housing is formed by using an insulation material have been described in the above embodiments. However, the housing may be a conductor as long as the housing is not connected to detection electrodes at an opposite side to a ground side of piezoelectric elements, and may be configured to be formed by plating a surface of an insulation body with the conductor.

The touch input device according to this configuration is used as, for example, part of frames of liquid crystal displays and bezels of mobile terminals such as smartphones and tablet terminals. In this case, the touch input device can be used for display control operation inputs of liquid crystal displays and for operation inputs corresponding to desired functions of mobile terminals. That is, functional units of liquid crystal displays and mobile terminals realize functions corresponding to operation inputs of the touch input device.

DESCRIPTION OF REFERENCE SYMBOLS

10, 10A, 10B, 10C, 10D: TOUCH INPUT DEVICE
20, 20A, 20D: PIEZOELECTRIC ELEMENT GROUP
21: PIEZOELECTRIC SHEET
30, 30A, 30B, 30C: ADHESIVE MEMBER
40: HOUSING
220D: INSULATION SUBSTRATE
221, 222, 223, 224: FIRST DETECTION ELECTRODE
230D: INSULATION FLEXIBLE SHEET
231, 232, 233, 234: SECOND DETECTION ELECTRODE
310: OPENING
311: FIRST ELONGATED MEMBER
312: SECOND ELONGATED MEMBER
321, 322, 323, 324, 325: INDIVIDUAL MEMBER
401: FRONT WALL
402: FIRST SIDEWALL
403: SECOND SIDEWALL
411, 412, 413, 414: OPERATION POSITION MARK

The invention claimed is:

1. A touch input device comprising:
a housing having a front wall extending in a longitudinal direction and having a front surface, a back surface opposite the front surface, a first side extending along the longitudinal direction, and a second side surface opposite the first side surface and extending along the longitudinal direction; a first sidewall connected to the first side surface and extending along the longitudinal direction; and a second sidewall connected to the second side surface and extending along the longitudinal direction;
a single piezoelectric sheet having a first surface and a second surface and extending along the longitudinal direction;
a first detection electrode on the first surface of the single piezoelectric sheet;
a second detection electrode on the second surface of the single piezoelectric sheet, the first detection electrode and the second detection electrode facing each other through the single piezoelectric sheet to form a first piezoelectric element having a flat film shape and producing a voltage when stretched in a direction parallel to a principal surface thereof;
a third detection electrode on the first surface of the single piezoelectric sheet and arranged in a row along the longitudinal direction with the first detection electrode;
a fourth detection electrode on the second surface of the single piezoelectric sheet and arranged in a row along the longitudinal direction with the second detection electrode, the third detection electrode and the fourth detection electrode facing each other through the single piezoelectric sheet to form a second piezoelectric element having a flat film shape and producing a voltage when stretched in a direction parallel to a principal surface thereof, wherein the first and second piezoelectric elements are constructed to detect a pressing location on the housing; and
an adhesive member adhering the first and second piezoelectric elements and/or the single piezoelectric sheet to the back surface of the front wall of the housing.

2. A touch input device comprising:
a housing having a front wall extending in a longitudinal direction and having a front surface, a back surface opposite the front surface, a first side extending along the longitudinal direction, and a second side surface opposite the first side surface and extending along the longitudinal direction; a first sidewall connected to the first side surface and extending along the longitudinal direction; and a second sidewall connected to the second side surface and extending along the longitudinal direction;
a single piezoelectric sheet having a first surface and a second surface and extending along the longitudinal direction;
a plurality of first detection electrodes on the first surface of the single piezoelectric sheet, the plurality of;
a plurality of second detection electrodes on the second surface of the single piezoelectric sheet, the plurality of first detection electrodes and the plurality of second detection electrodes respectively facing each other through the single piezoelectric sheet to form a plurality of piezoelectric elements, each of which having a flat film shape and producing voltages when stretched in a direction parallel to a principal surface thereof, and the plurality of piezoelectric elements are constructed to detect a pressing location on the housing and are arranged in a row along the longitudinal direction with respect to each other; and
an adhesive member adhering the plurality of piezoelectric elements and/or the single piezoelectric sheet to the back surface of the front wall of the housing.

3. The touch input device according to claim 2, wherein the plurality of piezoelectric elements are aligned in an interval and separated from each other when viewed in a plan view of the touch input device such that, when a first piezoelectric element opposed to a pushed position on the front surface of the housing produces a voltage, a second piezoelectric element adjacent the first piezoelectric element produces a voltage 0 to 1/10 of that produced by the first piezoelectric element.

4. The touch input device according to claim 2, wherein a modulus of the adhesive member is lower than a modulus of the housing.

5. The touch input device according to claim 4, wherein the modulus of the adhesive member is $10^7$ Pa or less.

6. The touch input device according to claim 1, wherein a modulus of the adhesive member is lower than a modulus of the housing.

7. The touch input device according to claim 6, wherein the modulus of the adhesive member is $10^7$ Pa or less.

8. The touch input device according to claim 1, wherein a modulus of the adhesive member is the same as a modulus of the housing.

9. The touch input device according to claim 2, wherein the adhesive member is shaped so as to not overlap the plurality of first detection electrodes.

10. The touch input device according to claim 9, wherein the adhesive member defines a plurality of openings, each of the plurality of first detection electrodes being aligned within a respective opening of the plurality of openings.

11. The touch input device according to claim 9, wherein the adhesive member includes a first elongated member and a second elongated member.

12. The touch input device according to claim 9, wherein the adhesive member includes a plurality of individual members positioned between adjacent detection electrodes of the plurality of first detection electrodes.

13. The touch input device according to claim 1, further comprising an insulation sheet between the adhesive member and the first and second piezoelectric elements.

14. The touch input device according to claim 2, wherein the plurality of piezoelectric elements each have a lateral direction and a longitudinal direction, and the adhesive member is configured such that the plurality of piezoelectric elements inhibit stretching in the lateral direction without attenuating stretching in the longitudinal direction.

15. The touch input device according to claim 2, wherein the plurality of piezoelectric elements each have a shape having a longitudinal dimension and a lateral dimension that are different from each other.

* * * * *